United States Patent
Igarashi et al.

(10) Patent No.: US 7,030,033 B2
(45) Date of Patent: *Apr. 18, 2006

(54) METHOD FOR MANUFACTURING CIRCUIT DEVICES

(75) Inventors: Yusuke Igarashi, Gunma (JP); Hideki Mizuhara, Aichi (JP); Noriaki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 163 days.

This patent is subject to a terminal disclaimer.

(21) Appl. No.: 10/663,394

(22) Filed: Sep. 16, 2003

(65) Prior Publication Data

US 2004/0092129 A1 May 13, 2004

(30) Foreign Application Priority Data

Sep. 26, 2002 (JP) .............................. 2002-281886

(51) Int. Cl.
*H01L 21/302* (2006.01)

(52) U.S. Cl. .......................... 438/754; 216/95; 216/96; 216/105; 216/106; 148/DIG. 105; 29/846; 29/847

(58) Field of Classification Search ................ 29/846, 29/847; 148/DIG. 105; 438/745, 754; 216/105, 216/106, 95, 96
See application file for complete search history.

(56) References Cited

U.S. PATENT DOCUMENTS

| 5,258,649 | A | * | 11/1993 | Tanaka et al. ............... 257/787 |
| 6,096,482 | A | * | 8/2000 | Omote et al. ............... 430/311 |
| 6,133,070 | A | * | 10/2000 | Yagi et al. .................. 438/121 |
| 2004/0097081 | A1 | * | 5/2004 | Igarashi et al. ............. 438/689 |
| 2004/0097086 | A1 | | 5/2004 | Igarashi et al. |
| 2004/0101995 | A1 | | 5/2004 | Sakai et al. |
| 2004/0106235 | A1 | | 6/2004 | Igarashi et al. |
| 2004/0106288 | A1 | | 6/2004 | Igarashi et al. |

* cited by examiner

*Primary Examiner*—Nadine G. Norton
*Assistant Examiner*—Eric B. Chen
(74) *Attorney, Agent, or Firm*—Fish & Richardson P.C.

(57) ABSTRACT

Priorly, semiconductor devices wherein a flexible sheet with a conductive pattern was employed as a supporting substrate, a semiconductor element was mounted thereon, and the ensemble was molded have been developed. In this case, problems occur that a multilayer wiring structure cannot be formed and warping of the insulating resin sheet in the manufacturing process is prominent. In order to solve these problems, a laminated plate 10 in which a thin first conductive film 11 and a thick second conductive film 12 have been laminated via a third conductive film 13 is used. After forming a conductive pattern layer 11A of a fine pattern by etching the thin first conductive film 11, anchor portions 15 are formed by overetching the third conductive film 13 by use of the conductive pattern layer 11A as a mask, and an insulating adhesive layer 16 and a sealing resin layer 22 are made to bite into the anchor portions 15 so as to strengthen bonding of the insulating adhesive layer 16 and sealing resin layer 22 with the conductive pattern 11A.

25 Claims, 9 Drawing Sheets

METHOD FOR MANUFACTURING CIRCUIT DEVICES

BACKGROUND OF THE INVENTION

1. Field of the invention

The present invention relates to a method for manufacturing circuit devices, and particularly, to a method for forming a low-profile circuit device using two conductive films laminated via a third conductive film to serve as a barrier layer in an etching step.

2. Description of the Related Art

In recent years, IC packages have increasingly been used in portable equipment and small-sized high-density mounting equipment, and conventional IC packages and mounting concepts have undergone drastic changes. This has been mentioned in, for example, Japanese Unexamined Patent Publication No. 2000-133678, which is a technique related to a semiconductor device employing a polyimide resin sheet of a flexible sheet as an example of its insulating resin sheet.

In FIG. 16 through FIG. 18, a flexible sheet 50 is employed as an interposer substrate. Herein, drawings shown in the upper part of the respective drawings are plan views, drawings shown in the lower part are sectional views along a line A—A.

First, on the flexible sheet 50 shown in FIG. 16, a copper foil pattern 51 is prepared by being adhered via an adhesive. This copper foil pattern 51 is different in its pattern depending on whether a semiconductor element to be mounted is a transistor or an IC, and in general, bonding pads 51A and an island 51B are formed. In addition, a symbol 52 shows an opening portion to lead out an electrode from the rear surface of the flexible sheet 50, and the copper foil pattern 51 is exposed therethrough.

Next, this flexible sheet 50 is transferred to a die bonder, and as shown in FIG. 17, semiconductor elements 53 are mounted. Thereafter, this flexible sheet 50 is transferred to a wire die bonder, and the bonding pads 51A and pads of the semiconductor elements 53 are electrically connected by metal wires 54.

Lastly, as in FIG. 18A, a sealing resin 55 is provided on the front surface of the flexible sheet 50 for sealing. Herein, transfer molding is performed so as to cover the bonding pads 51A, island 51B, semiconductor element 53, and metal wires 54.

Thereafter, as shown in FIG. 18B, connecting means 56 such as solder or solder balls are provided, and as a result of a pass through a solder reflow furnace, spherical solder 56 fusion-bonded with the bonding pads 51A via the opening portions 52 are formed. In addition, since the semiconductor elements 53 are formed in a matrix shape on the flexible sheet 50, dicing is performed as in FIG. 17 to separate the semiconductor elements individually.

In addition, in the sectional view shown in FIG. 18C, 51A and 51D are formed as electrodes on both surfaces of the flexible sheet 50. In general, this flexible sheet 50 is supplied after patterning of both surfaces by a manufacturer.

A semiconductor device using the above-described flexible sheet 50 uses no widely-known metal frame and, therefore, has an advantage such that an extremely small-sized low-profile package can be realized, however, substantially, wiring is carried out by only one-layer copper pattern 51 provided on the front surface of the flexible sheet 50. Therein exists a problem such that, since the flexible sheet is flexible, distortion occurs before and after a pattern formation of a conductive film, and this is not suitable for a multilayer wiring structure since displacement between laminated layers is great.

In order to improve supporting strength to suppress the sheet distortion, it is necessary to sufficiently thicken the flexible sheet 50 to approximately 200 μm, and this goes against a reduction in thickness.

Furthermore, in terms of a manufacturing method, in the aforementioned manufacturing devices, for example, in the die bonder, wire bonder, transfer molding device, reflow furnace, etc., the flexible sheet 50 is transferred and attached to a part called a stage or a table.

However, when the thickness of an insulating resin to serve as a base of the flexible sheet 50 is reduced to approximately 50 μm, if the thickness of the copper foil pattern 51 formed on the front surface is also thin such as 9–35 μm, transferring characteristics are considerably inferior due to warping as shown in FIG. 19, and attaching characteristics to the aforementioned stage or table are inferior, therein exists a drawback. This is considered to be warping owing to that the insulating resin itself is considerably thin and warping owing to a difference in the thermal expansion coefficient between the copper foil pattern 51 and insulating resin.

In addition, since the part of the opening portions 52 is pressured from the upside during molding, a force to warp the circumferences of the bonding pads 51A upward may act to deteriorate the bonding pads 51A in adhesive properties.

In addition, if the resin material itself to form a flexible sheet 50 lacks flexibility or if a filler is mixed to enhance thermal conductivity, the flexible sheet 50 becomes rigid. In this condition, when bonding is performed by a wire bonder, the bonding part may crack. In addition, during transfer molding, the part where the metal mold is brought into contact may crack. This appears more prominently if warping exists as shown in FIG. 19.

Although the flexible sheet 50 described above is a flexible sheet on whose rear surface no electrode is formed, an electrode 51D may be formed, as shown in FIG. 18C, on the rear surface of the flexible sheet 50, as well. In this case, since the electrode 51D is brought into contact with the manufacturing devices or is brought into contact with the transferring surfaces of transferring means between the manufacturing devices, there exists a problem such that damage occurs to the rear surface of the electrode 51D. Since the electrode is formed with this damage included, there also exist problems, such that the electrode 51D itself cracks afterward by a heat application and solder wettability declines in a solder connection to a motherboard.

In addition, during transfer molding, a problem also occurs such that a sufficient sealing structure cannot be realized because of weak adhesive properties between the flexible sheet 50 and copper foil pattern 51 and the insulating resin.

SUMMARY OF THE INVENTION

In order to solve such problems, the present inventors have proposed using a laminated plate formed by laminating a thin first conductive film and a thick second conductive film via a third conductive film.

First, the preferred embodiments include that a method for manufacturing circuit devices comprises: a step for preparing a laminated plate by laminating a thin first conductive film and a thick second conductive film via a third conductive film; a step for forming a fine conductive pattern layer by etching the first conductive film into a desirable pattern; a step for removing the third conductive film by use of the conductive pattern layer as a mask and thus forming anchor portions where the third conductive film is depressed further inside than the conductive pattern layer; a step for fixedly fitting semiconductor elements on the conductive pattern layer via an insulating adhesive layer and filling the insulating adhesive layer into the anchor portions; a step for electrically connecting electrodes of the semiconductor elements with predetermined parts of the conductive pattern layer; a step for covering the semiconductor elements with a sealing resin layer and filling the sealing resin layer into the anchor portions; and a step for exposing the sealing resin layer and the third conductive film on the rear surface by removing the second conductive film. In particular, the preferred embodiments have a feature in forming anchor portions by removing the third conductive film by use of the conductive pattern layer as a mask and thus providing an anchoring effect by a sealing resin layer.

Second, the preferred embodiments include that the third conductive film is used as an etching stopper when the first conductive film is etched.

Third, the preferred embodiments include that a solution containing ferric chloride or cupric chloride is used as a solution to perform the etching.

Fourth, the preferred embodiments include that the anchor portions are formed by overetching the third conductive film by use of the conductive pattern layer as a mask.

Fifth, the preferred embodiments include that the etching solution is an iodine-based solution.

Sixth, the preferred embodiments include that the third conductive film is peeled off by electrolysis by use of the conductive pattern layer as a mask, and the anchor portions are formed by over-peeling.

Seventh, the preferred embodiments include that the third conductive film and the sealing resin layer in the anchor portions remaining after entirely etching the second conductive film are exposed.

Eighth, the preferred embodiments include that ball-like external electrodes are formed on the rear surface by adhering a brazing filler material to the remaining third conductive film.

Ninth, the preferred embodiments include that a method for manufacturing circuit devices comprises: a step for preparing a laminated plate by laminating a thin first conductive film and a thick second conductive film via a third conductive film; a step for selectively forming pads formed of a fourth conductive film on the first conductive film; a step for forming a fine conductive pattern layer by etching the first conductive film into a desirable pattern; a step for removing the third conductive film by use of the conductive pattern layer as a mask and thus forming anchor portions where the third conductive film is depressed further inside than the conductive pattern layer; a step for fixedly fitting semiconductor elements on the conductive pattern layer via an insulating adhesive layer and filling the insulating adhesive layer into the anchor portions; a step for electrically connecting electrodes of the semiconductor elements with the pads on predetermined parts of the conductive pattern layer; a step for covering the semiconductor elements with a sealing resin layer and filling the sealing resin layer into the anchor portions; and a step for exposing the sealing resin layer and third conductive film on the rear surface by removing the second conductive film. In particular, the preferred embodiments have a feature in selectively providing pads and external electrodes on the conductive pattern layer.

Tenth, the preferred embodiments include that the third conductive film is used as an etching stopper when the first conductive film is etched.

Eleventh, the preferred embodiments include that a solution containing ferric chloride or cupric chloride is used as a solution to perform the etching.

Twelfth, the preferred embodiments include that the anchor portions are formed by overetching the third conductive film by use of the conductive pattern layer as a mask.

Thirteenth, the preferred embodiments include that the etching solution is an iodine-based solution.

Fourteenth, the preferred embodiments include that the third conductive film is peeled off by electrolysis by use of the conductive pattern layer as a mask, and the anchor portions are formed by over-peeling.

Fifteenth, the preferred embodiments include that the third conductive film and the sealing resin layer in the anchor portions remaining after entirely etching the second conductive film are exposed.

Sixteenth, the preferred embodiments include that ball-like external electrodes are formed on the rear surface by adhering a brazing filler material to the remaining third conductive film.

According to the preferred embodiments, in the step for forming a conductive pattern layer, the first conductive film can be fully etched by providing the third conductive film 13 as a barrier layer, therefore, an advantage is provided such that etching for a conductive pattern can be easily performed and unnecessary etching of other conductive films is prevented.

In addition, anchor portions can be formed in self-alignment by the third conductive film depressed around the conductive pattern layer by overetching or over-peeling the third conductive film by use of the conductive pattern layer as a mask, and these anchor portions are filled when the semiconductor elements are covered with the sealing resin layer later, therefore, an advantage is provided such that biting between the sealing resin layer and insulating adhesive layer and the conductive pattern layer is strengthened to realize a satisfactory sealing condition.

Furthermore, when the second conductive film is entirely removed, the third conductive film functions as a barrier layer to etching with the sealing resin layer, therefore, an advantage is provided such that removal of the second conductive film without a mask can be made possible.

DESCRIPTION OF THE PREFERRED EMBODIMENTS

Figure 1:
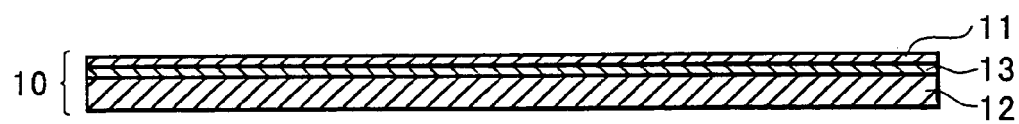
FIG. 1 is a sectional view for explaining a method for manufacturing circuit devices of the preferred embodiments.

A method for manufacturing circuit devices of the preferred embodiments will be described in detail with reference to FIG. 1 through FIG. 14.

A method for manufacturing circuit devices of the preferred embodiments comprises: a step for preparing a laminated plate 10 by laminating a thin first conductive film 11 and a thick second conductive film 12 via a third conductive film 13; a step for selectively forming pads 14A formed of a fourth conductive film 14 on the first conductive film 11; a step for forming a fine conductive pattern layer 11A by etching the first conductive film 11 into a desirable pattern; a step for removing the third conductive film 13 by use of the conductive pattern layer 11A as a mask and thus forming anchor portions 15 where the third conductive film 13 is depressed further inside than the conductive pattern layer 11A; a step for fixedly fitting semiconductor elements 19 on the conductive pattern layer 11A via an insulating adhesive layer, filling the insulating adhesive layer into the anchor portions 15, and electrically connecting electrodes of the semiconductor elements 19 with the pads 14A on predetermined parts of the conductive pattern layer 11A; a step for covering the semiconductor elements 19 with a sealing resin layer 22 and filling the sealing resin layer 22 into the anchor portions 15; and a step for exposing the sealing resin layer 22 and the third conductive film 13 on the rear surface by removing the second conductive film 12. Such respective steps will be described in the following.

The first step of the preferred embodiments can be, as shown in FIG. 1, for preparing a laminated plate 10 by laminating a thin first conductive film 11 and a thick second conductive film 12 via a third conductive film 13.

On the front surface of the laminated plate 10, the first conductive film 11 is formed substantially throughout the whole area, and the second conductive film 12 is formed substantially throughout the whole area of the rear surface via the third conductive film 13, as well. The first conductive film 11 and second conductive film 12 are, preferably, made of Cu as a main material or are made of a widely-known lead frame material. The first conductive film 11, second conductive film 12, and third conductive film 13 can be formed by a plating method, an evaporation method, or a sputtering method, or a metal foil formed by a rolling method or a plating method can be adhered to the same. Moreover, as the first conductive film 11 and second conductive film 12, Al, Fe, Fe—Ni, a widely-known lead frame material and the like can be employed.

As the material of the third conductive film 13, a material is employed which is not etched by an etchant used when the first conductive film 11 and second conductive film 12 are removed. In addition, since external electrodes 24 of solder or the like are formed on the rear surface of the third conductive film 13, adhesion of the external electrodes 24 is also considered. Concretely, a conductive film composed of gold, silver, and palladium can be employed as a material of the third conductive film 13.

The first conductive film is formed thin in thickness to form a fine pattern, and the thickness is approximately 5–35 μm. The second conductive pattern is formed thick to mechanically support the whole, and the thickness is approximately 35–150 μm. The third conductive film 13 functions as a barrier layer when the first conductive film 11 and second conductive film 12 are etched, and is formed with a thickness of approximately 2–10 μm.

Accordingly, by forming the second conductive film 12 thick, flatness of the laminated plate 10 can be maintained, whereby, workability in the following steps can be improved.

Furthermore, the second conductive film 12 is damaged through various steps. However, the thick second conductive film 12 is to be removed in a later step, so that damage is prevented from remaining in a circuit device of a finished product. In addition, since the sealing resin can be hardened while flatness is maintained, the rear surface of a package can also be flattened, and the external electrodes formed on the rear surface of the laminated plate can also be arranged flat. Therefore, electrodes on a mounting substrate can be brought into contact with the electrodes on the rear surface of the laminated plate 10, whereby a soldering failure can be prevented.

Next, a concrete manufacturing method for the aforementioned laminated plate 10 will be described. A laminated plate 10 can be manufactured by lamination by electroplating or by rolling and joining. When laminated plate 10 is manufactured by electroplating, first, a second conductive film 12 is prepared. Then, electrodes are provided on the rear surface of the second conductive film 12, and a third conductive film is laminated by an electrolytic plating method. Thereafter, similarly by an electrolytic plating method, a first conductive film is laminated on the third conductive film. When a laminated plate 10 is manufactured by rolling, a first conductive film 11, a second conductive film 12, and a third conductive film 13 which have been prepared in a plate shape are joined under pressure by a roll or the like.

Figure 2:
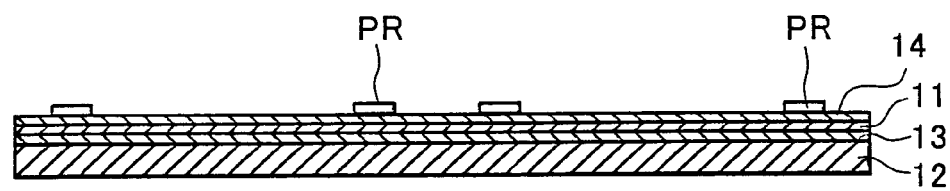
FIG. 2 is a sectional view for explaining a method for manufacturing circuit devices of the preferred embodiments.
Figure 3:
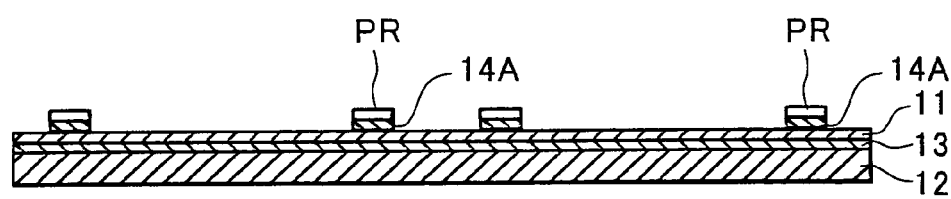
FIG. 3 is a sectional view for explaining a method for manufacturing circuit devices of the preferred embodiments.
Figure 4:
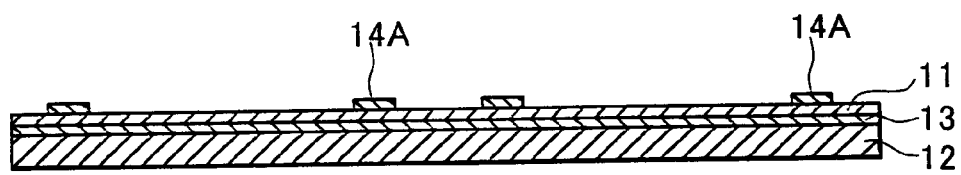
FIG. 4 is a sectional view for explaining a method for manufacturing circuit devices of the preferred embodiments.

The second step of the preferred embodiments is, as shown in FIG. 2 through FIG. 4, for selectively forming pads 14A formed of a fourth conductive film 14 on the first conductive film 11.

In this step, as shown in FIG. 2, a fourth conductive film 14 is formed on the whole surface of the first conductive film 11 by electroplating. As the fourth conductive film, silver plating is suitable for the first conductive film 11 and for providing etching with selectivity, and pads to which bonding wires are fixedly fitted will be formed later on. Furthermore, preappointed pad regions on the fourth conductive film 14 are covered with a photoresist PR.

Next, as shown in FIG. 3, pads 14A are formed by etching, with an iodine-based solution, the fourth conductive film 14 exposed through the photoresist PR as a mask. At this time, the first conductive film 11 is not etched by the iodine-based solution since this has been formed of copper.

Furthermore, as shown in FIG. 4, the photoresist PR is removed to expose the pads 14A.

Herein, the method for forming pads 14A can be a method for selectively forming pads with gold plating or silver plating on preappointed pad regions while exposing the preappointed pad regions and covering the rest with a photoresist.

Figure 5:
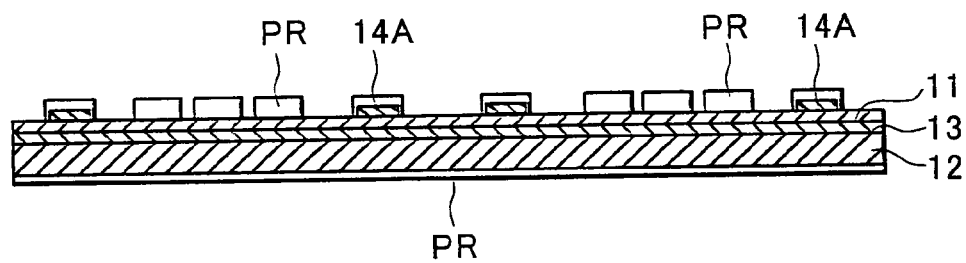
FIG. 5 is a sectional view for explaining a method for manufacturing circuit devices of the preferred embodiments.
Figure 6:
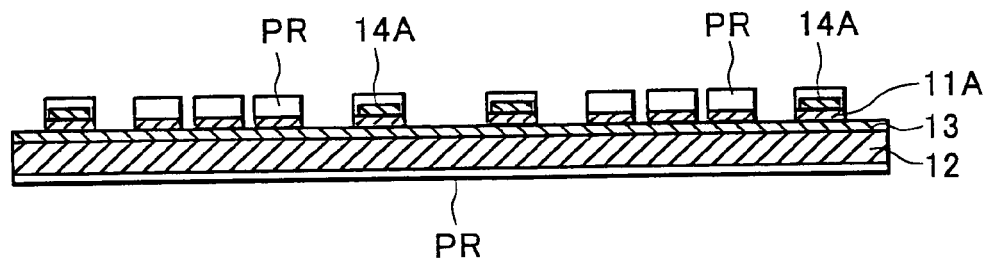
FIG. 6 is a sectional view for explaining a method for manufacturing circuit devices of the preferred embodiments.

The third step of the preferred embodiments can be, as shown in FIG. 5 and FIG. 6, for forming a conductive pattern layer 11A by etching the first conductive film 11 into a desirable pattern.

The first conductive film 11 is covered with a photoresist PR of a desirable pattern, and a conductive pattern layer 11A to form wiring is formed by chemical etching. Since the first conductive film 11 is made of Cu as a main material, ferric chloride or cupric chloride is sufficient as an etchant. As a result of etching of the first conductive film 11, the third conductive film 13 also comes into contact with the etchant, however, since the material for the third conductive film 13 is not etched by ferric chloride or cupric chloride, etching stops on the front surface of the third conductive film 13. Thus, since the first conductive film 11 has been formed with a thickness of approximately 5–35 μm, the conductive pattern layer 11A can be formed as a fine pattern of 50 μm or less. Moreover, the rear surface of the second conductive film 12 is covered with a photoresist PR or a cover film and is thus protected from the etchant during chemical etching for the conductive pattern layer 11A.

This step includes that etching is stopped at the third conductive film 13 when the first conductive film 11 is etched. Since etching of the first conductive film 11 can be thereby carried out as full etching, an advantage is provided in that stable etching can be realized. In this step, the first conductive film 11 to be etched is formed mainly of Cu, and ferric chloride or cupric chloride is used as an etchant to selectively remove the Cu. In contrast there to, since the third conductive film 13 is formed of a conductive material which is not etched by ferric chloride or cupric chloride, etching stops at the front surface of the conductive film 13. As the material for the third conductive film 13, gold, silver, and palladium can be employed.

Figure 7:
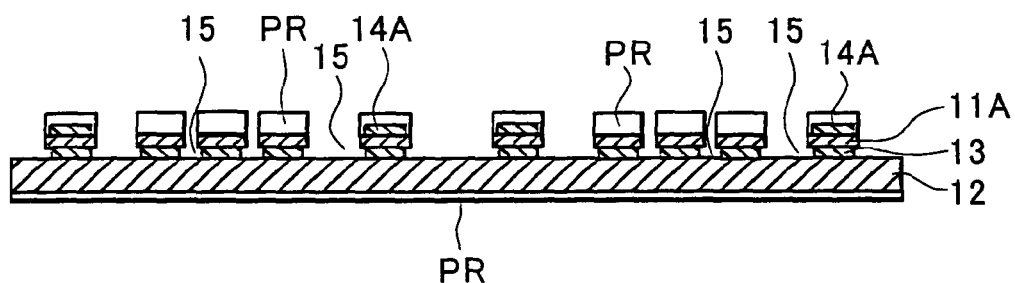
FIG. 7 is a sectional view for explaining a method for manufacturing circuit devices of the preferred embodiments.
Figure 8:
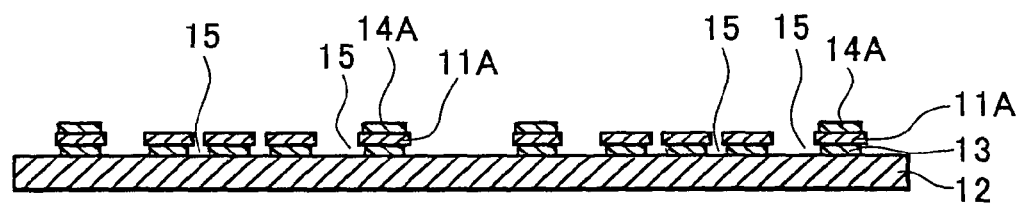
FIG. 8 is a sectional view for explaining a method for manufacturing circuit devices of the preferred embodiments.

The fourth step of the preferred embodiments is, as shown in FIG. 7 and FIG. 8, for removing the third conductive film 13 by use of the conductive pattern layer 11A as a mask and thus forming anchor portions 15 where the third conductive film 13 is depressed further inside than the conductive pattern layer 11A.

The third conductive film 13 is selectively removed by use of the conductive pattern layer 11A formed of the first conductive film 11 in the previous step. Two methods can be employed for selectively removing the third conductive film 13. A first method thereof is an etching method by use of a solution to remove only the third conductive film 13. A second method thereof is a method for removing only the third conductive film 13 by electrolytic peeling.

As the first method, a method for partially removing the third conductive film 13 by etching will be described. As an etchant used in this method, an etchant is employed which etches the third conductive film 13 and does not etch the first conductive pattern 11A or second conductive film 12. For example, in a case where the conductive pattern 11A and second conductive film 12 are formed of a material mainly of Cu and the third conductive film 13 is an Ag film, only the third conductive film 13 can be removed by using an iodine-based etchant. As a result of etching of the third conductive film 13, the second conductive film 12 comes into contact with the iodine-based etchant, however, the second conductive film 12 made of, for example, Cu is not etched by the iodine-based etchant. Accordingly, etching herein performed stops at the front surface of the second conductive film 12. By performing overetching in this etching, the third conductive film 13 is overetched, thus anchor portions 15 where the third conductive film 13 is depressed further inside than the peripheral ends of the conductive pattern layer 11A are formed.

As the second method, a method for removing only the third conductive film 13 by electrolytic peeling will be described. First, a solution containing metal ions is brought into contact with the third conductive film 13. Then, a positive electrode is provided in the solution, a negative electrode is provided on the laminated plate 10, and a direct current is applied. Thereby, only the third conductive film 13 is removed based on a principle reverse to that of plating film formation by an electrolytic method. The solution herein used is a solution used when the material composing the third conductive film 13 is plated. Accordingly, in this method, only the third conductive film 13 is peeled off. By performing over-peeling in this electrolytic peeling, the third conductive film 13 is over-peeled, thus anchor portions 15 where the third conductive film 13 is depressed further inside than the peripheral ends of the conductive pattern layer 11A are formed.

This step includes forming anchor portions 15 intentionally by overetching or over-peeling. In addition, since the anchor portions 15 are formed by using the conductive pattern layer 11A as a mask, owing to a self-alignment effect, the anchor portions 15 are formed around the conductive pattern layer 11A with uniform concavity.

Figure 9:
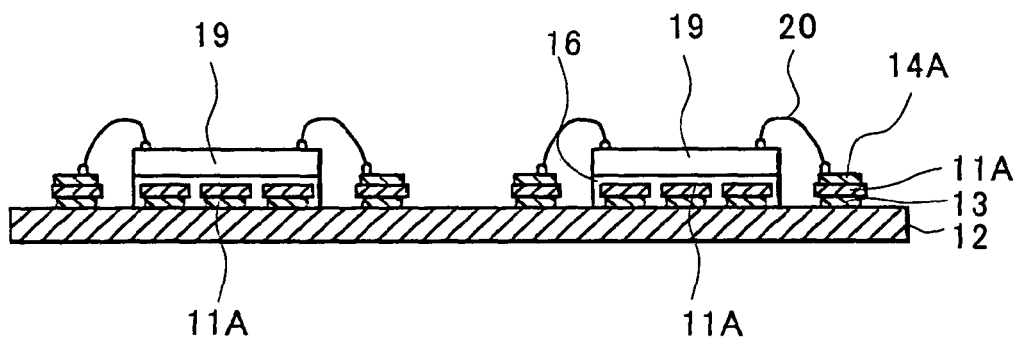
FIG. 9 is a sectional view for explaining a method for manufacturing circuit devices of the preferred embodiments.

The fifth step of the preferred embodiments is, as shown in FIG. 9, for fixedly fitting semiconductor elements 19 on the conductive pattern layer 11A via an insulating adhesive layer 16 and electrically connecting electrodes of the semiconductor elements 19 with the pads 14A on predetermined parts of conductive pattern layers 11A.

An insulating sheet is adhered to the rear surface of a wafer with semiconductor elements 19 formed in advance, this is adhered to a wafer dicing sheet, the wafer and insulating sheet are diced together to form dice each having an insulating adhesive layer 16 on the rear surface of the semiconductor element 19.

The aforementioned insulating sheet can be provided by a vacuum press or laminating method. A vacuum press is a method for overlapping a prepreg sheet made of a thermosetting resin and pressing the same in vacuo. In a laminating method, a thermosetting resin or photosensitive resin sheet is applied to each semiconductor wafer by means of a roller. In this method, although after-curing is carried out in a separate step by batch processing, an advantage such that the thickness can be accurately controlled is provided.

The semiconductor elements 19 are, in the state of bare chips, die-bonded onto the conductive pattern layer 11A in a manner bringing the insulating adhesive layer 16 into contact therewith. At this time, the insulating adhesive layer 16 is heat-melted and is filled into the anchor portions 15 formed in the conductive pattern layer 11A, whereby secure adhesion can be realized.

In addition, the respective electrode pads of the semiconductor element 19 are connected to the pads 14A provided at predetermined positions of the surrounding conductive pattern layer 11A via bonding wires 20. The semiconductor element 19 can be mounted face-down. In this case, solder balls or bumps are provided on the front surfaces of the respective electrode pads of the semiconductor element 19, while on the front surface of the laminated plate 10, electrodes similar to the bonding pads formed of the conductive pattern layer 11A are provided at parts corresponding to the solder ball positions.

Now, an advantage of using the laminated plate 10 in wire bonding will be described. In general, when wire bonding is carried out with Au wires, this is heated at 200° C.–300° C. At this time, if the second conductive film 12 is thin, the laminated plate 10 warps, and in this condition, if the laminated plate 10 is pressurized via a bonding head, there is a possibility that damage occurs to the laminated plate 10. However, these problems can be solved by forming the second conductive film 12 itself thick.

Figure 10:
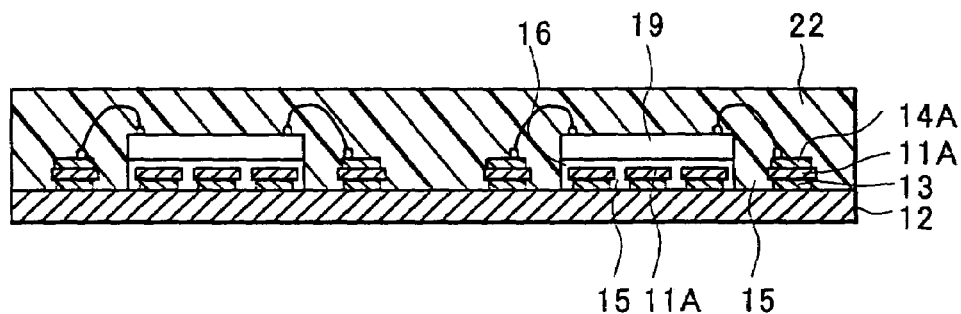
FIG. 10 is a sectional view for explaining a method for manufacturing circuit devices of the preferred embodiments.

The sixth step of the preferred embodiments is, as shown in FIG. 10, for covering the semiconductor elements 19 with a sealing resin layer 22 and filling the sealing resin layer 22 into the anchor portions 15.

The laminated plate 10 is set in a molding device for resin molding. As a molding method, transfer molding, injection molding, coating, dipping and the like can be carried out. However, considering productivity, transfer molding and injection molding are suitable.

In this step, when performing molding with the sealing resin layer 22, the sealing resin layer 22 is filled into the anchor portions 15 formed by a concavity in the third conductive film 13 formed on the front surface of the second conductive film 12, therein exists an advantage such that bonding between the sealing resin layer 22 and conductive pattern layer 11A is strengthened by an anchoring effect.

In addition, in this step, it is necessary that the laminated plate 10 is brought into contact flatly with a lower metal mold of a mold cavity, and the thick second conductive film 12 performs this function. Moreover, even after removal from the mold cavity, flatness of the package is maintained by the second conductive film 12 until contraction of the sealing resin layer 22 is completely finished. Namely, a role of mechanically supporting the laminated plate 10 until this step is assumed by the second conductive film 12.

Figure 11:
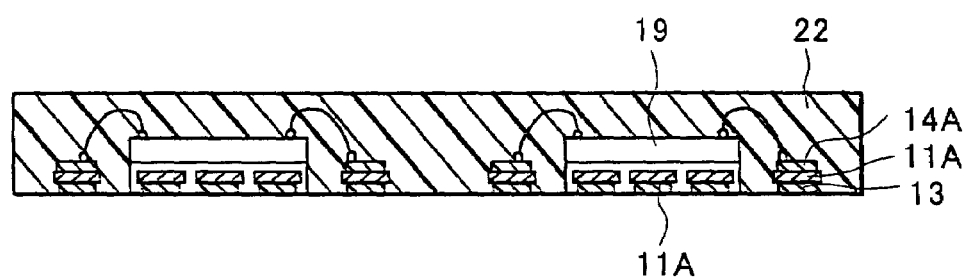
FIG. 11 is a sectional view for explaining a method for manufacturing circuit devices of the preferred embodiments.

The seventh step of the preferred embodiments is, as shown in FIG. 11, for exposing the sealing resin layer 22 and the third conductive film 13 on the rear surface by removing the second conductive layer 12.

In this step, the second conductive film 12 is etched without masking so that the whole surface is removed. In this etching, chemical etching by use of ferric chloride or cupric chloride is sufficient, and the second conductive film 12 is entirely removed. By thus entirely removing the second conductive film 12, the third conductive film 13 is exposed through the sealing resin layer 22. As described above, since the third conductive film 13 is formed of a material which is not etched by a solution to etch the second conductive film 12, the third conductive film 13 is not etched in this step.

This step includes that when the second conductive layer 12 is removed by etching, the third conductive film 13 functions as a barrier layer even without using a mask, therefore, a rear surface composed of the sealing resin layer 22 and third conductive film 13 is formed flat. Since the second conductive film 12 is entirely removed by etching, the third conductive film 13 also comes into contact with the etchant in the final stage of etching. As described above, the third conductive film 13 is formed of a material which is not etched by ferric chloride or cupric chloride that etch the second conductive film 12 made of Cu. Accordingly, since etching stops at the lower surface of the third conductive film 13, the third conductive film 13 functions as an etching barrier layer. Moreover, in and after this step, the ensemble is mechanically supported by the sealing resin layer 22.

Figure 12:
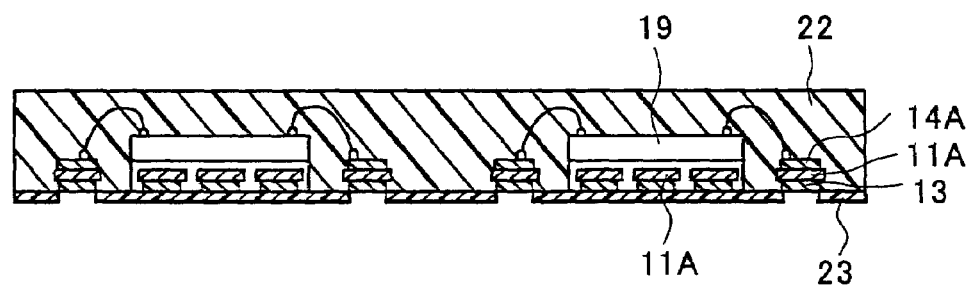
FIG. 12 is a sectional view for explaining a method for manufacturing circuit devices of the preferred embodiments.
Figure 13:
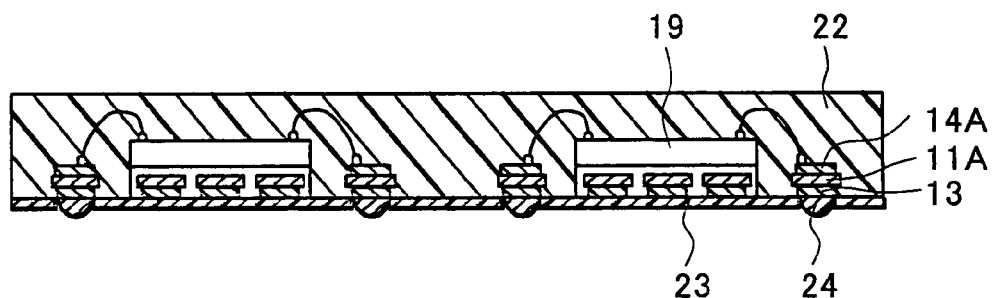
FIG. 13 is a sectional view for explaining a method for manufacturing circuit devices of the preferred embodiments.
Figure 14:
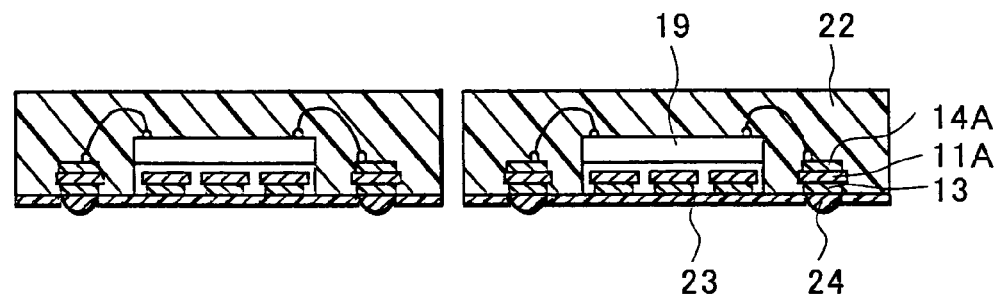
FIG. 14 is a sectional view for explaining a method for manufacturing circuit devices of the preferred embodiments.

The last step of the preferred embodiments is, as shown in FIG. 12 through FIG. 14, for forming a ball grid array structure.

For a ball grid array structure, the third conductive film 13 is, for the most part, covered with an overcoat resin 23 by screen-printing with an epoxy resin dissolved in a solvent while exposing parts to form external electrodes 24. Next, as shown in FIG. 13, by screen-printing with a solder cream and by solder reflow, external electrodes 24 are formed in these exposed parts. Subsequently, as shown in FIG. 14, since a large number of circuit devices are formed on the laminated plate 10 in a matrix shape, these are separated into individual circuit devices by dicing the sealing resin layer 22 and overcoat resin 23.

In this step, since the circuit devices can be separated into individual circuit devices by dicing the sealing resin layer 22 and overcoat resin 23, frictional wear of a dicer to perform dicing can be reduced.

Figure 15:
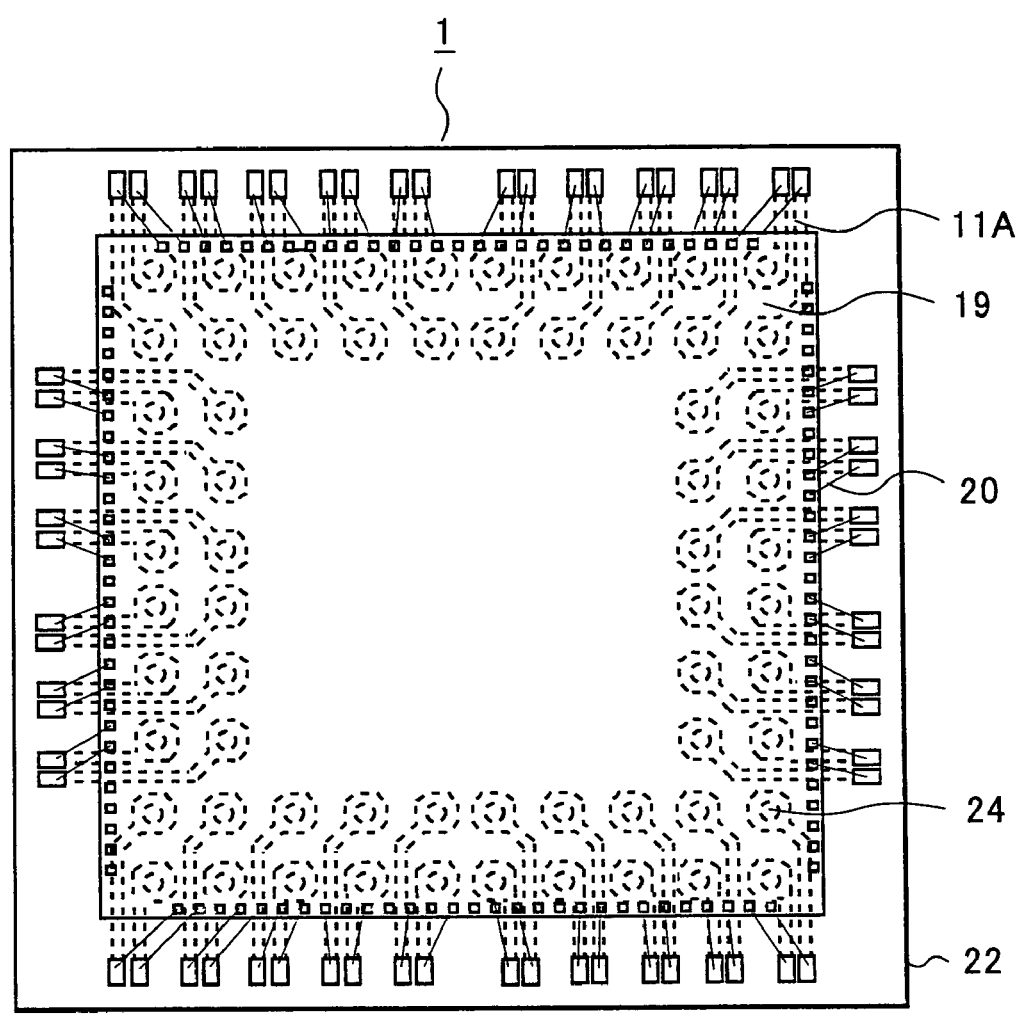
FIG. 15 is a plan view for explaining a circuit device manufactured according to the preferred embodiments.
Figure 16:
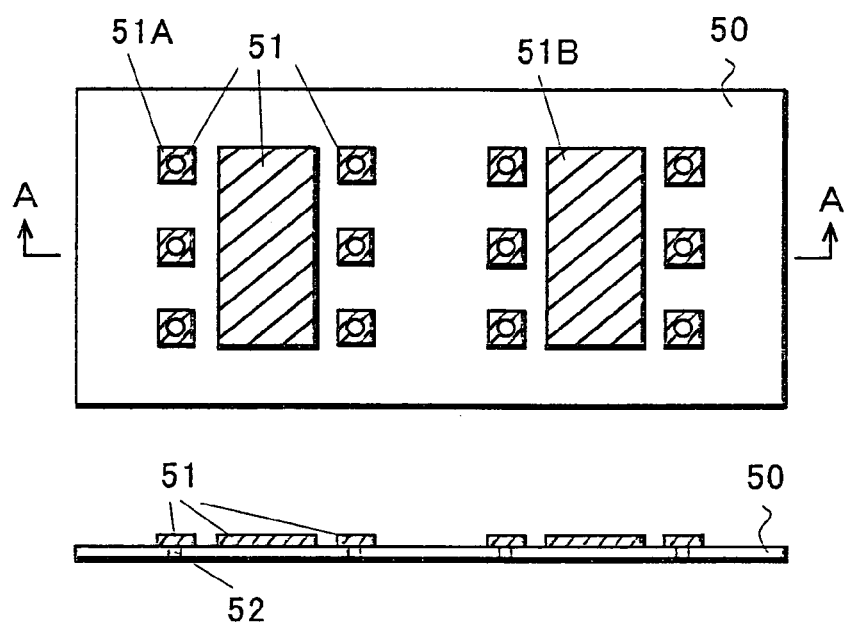
FIG. 16 is a view for explaining a conventional method for manufacturing semiconductor devices.
Figure 17:
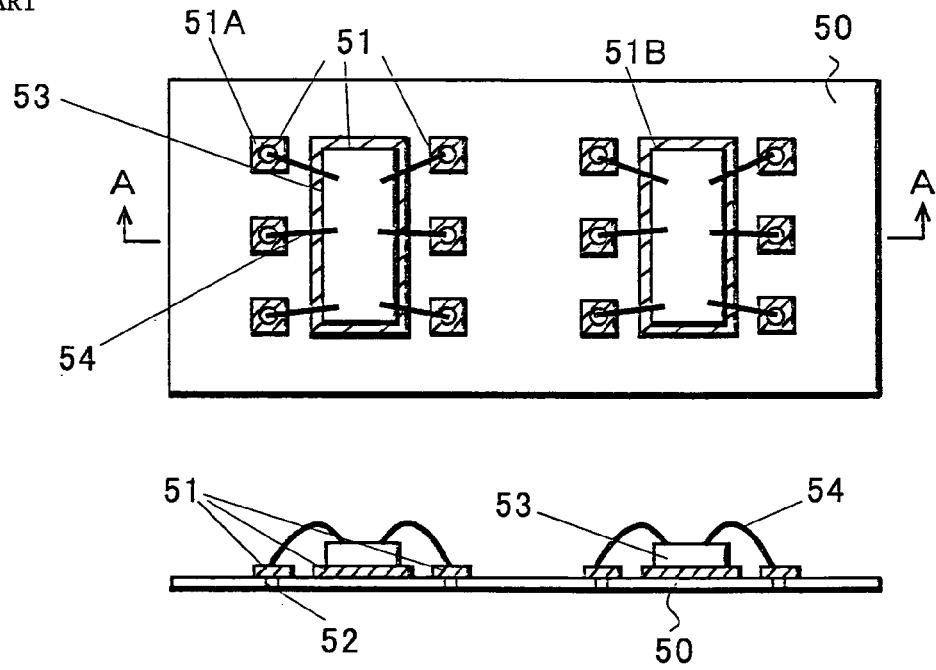
FIG. 17 is a view for explaining a conventional method for manufacturing semiconductor devices.
Figure 18A:
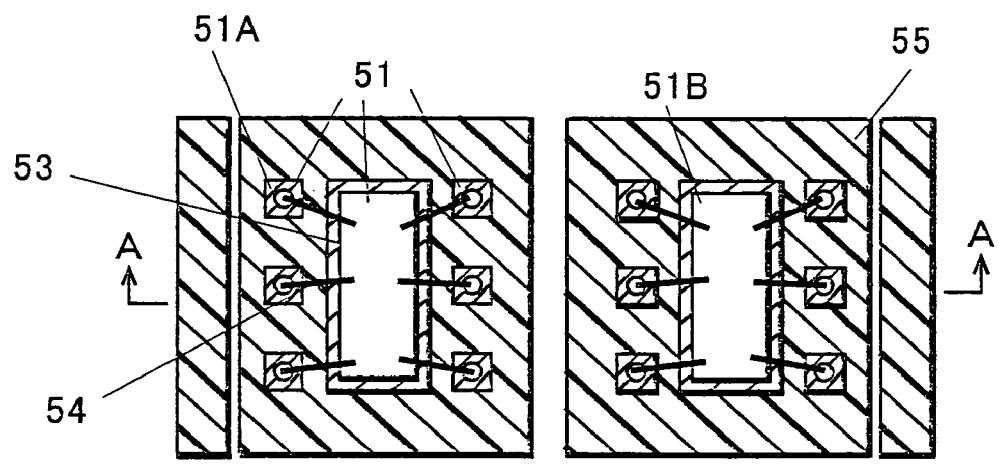
FIG. 18 is a view for explaining a conventional method for manufacturing semiconductor devices.
Figure 18B:
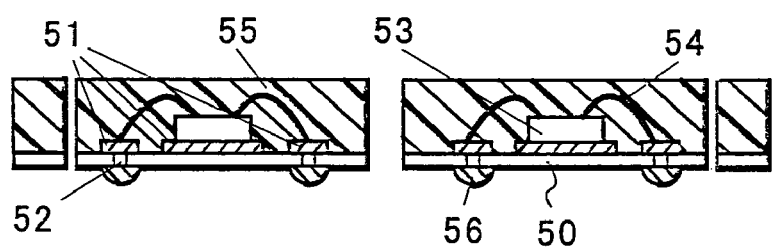
Figure 18C:
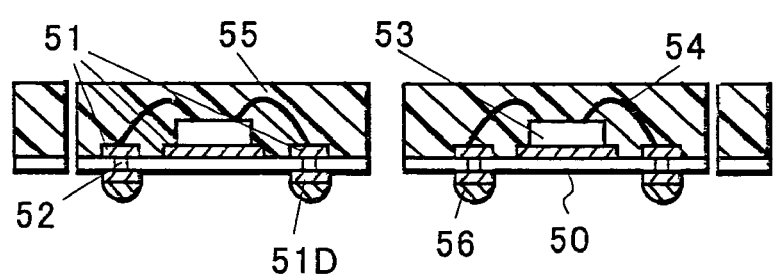
Figure 19:
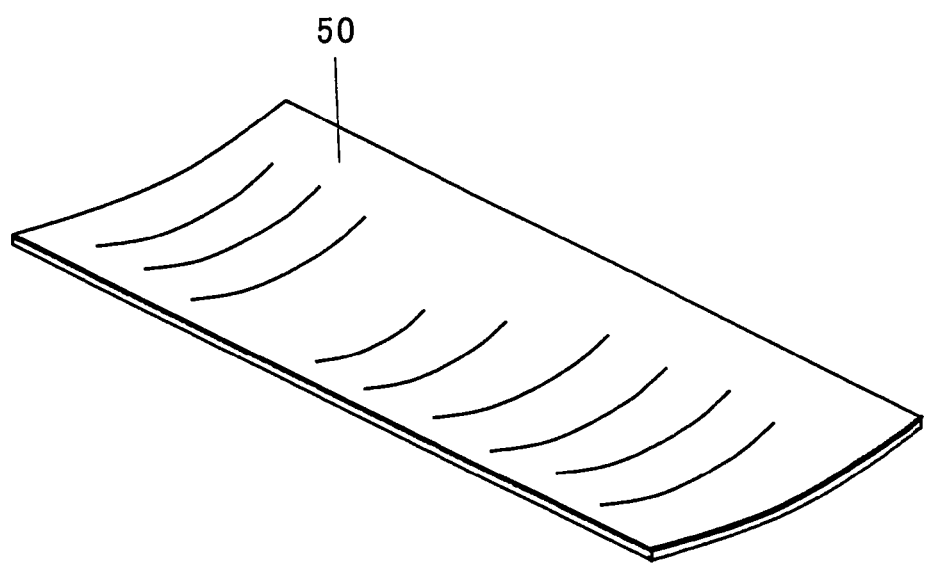
FIG. 19 is a view for explaining flexible sheet used in the related art.

With reference to FIG. 15, a concrete circuit device achieved according to a manufacturing method of the preferred embodiments will be described. The pattern shown by dotted lines is a conductive wiring layer 11A. In a manner surrounding the semiconductor element 19, bonding pads formed of the conductive wiring layer 11A are provided, while pads formed of the conductive wiring layer 11A are formed in a region corresponding to the lower side of the semiconductor element 19. Herefrom, it is understood that a pattern made up of the conductive wiring layer 11A can be formed in the region below the semiconductor element 19 as well. In addition, the conductive wiring layer 11A can form a fine pattern, therefore, more external electrodes 24 can be formed.

With such a structure, even in a case of a semiconductor element 19 having 200 pads or more, a finely patterned, desirable conductive pattern can be formed by utilizing the fine pattern of the conductive wiring layer 11A, therefore, connection from external electrodes 24 to an external circuit can be carried out.

What is claimed is:

1. A method of manufacturing a support on which to mount semiconductor elements, the method comprising:
   providing a laminated plate in which a first conductive film and a thicker second conductive film are laminated via a third conductive film;
   etching the first conductive film to form a fine conductive pattern layer; and
   removing the third conductive film while using the conductive pattern layer as a mask to form anchor portions, wherein the third conductive film is depressed further inside than the conductive pattern layer.

2. The method of claim 1, wherein said third conductive film is used as an etching stopper when the first conductive film is etched.

3. The method of claim 2, wherein a solution containing ferric chloride or cupric chloride is used as a solution to perform said etching.

4. The method of claim 1, wherein said anchor portions are formed by over-etching said third conductive film by use of said conductive pattern layer or a resist for forming said conducive pattern as a mask.

5. The method of claim 4, wherein said etching solution is an iodine-based solution.

6. The method of claim 1, wherein said third conductive film is peeled off by electrolysis by use of said conductive pattern layer or a resist for forming said conducive pattern as a mask, and said anchor portions are formed by over-peeling.

7. The method of claim 1, wherein said third conductive film and said sealing resin layer in said anchor portions, which remain after entirely etching the second conductive film, are exposed.

8. The method of claim 7, wherein external electrodes are formed by adhering a brazing filler material to the remaining third conductive film.

9. A method of manufacturing circuit devices using a substrate comprising a thick conductive film that supports a fine conductive pattern layer on a conductive film pattern, wherein portions of the fine conductive pattern layer extend beyond corresponding portions of the conductive film pattern to form anchor portions between adjacent portions of the conductive film pattern, the method comprising;
mounting semiconductor elements on said conductive pattern layer of said substrate via an insulating adhesive layer, wherein the insulating adhesive layer partially fills the anchor portions;
electrically connecting electrodes of the semiconductor elements with portions of said conductive pattern layer;
covering the semiconductor elements with a sealing resin layer and filling remaining sections of the anchor portions with the sealing resin layer; and
removing said thick conductive film to expose rear surfaces of the sealing resin layer and said conductive film pattern.

10. A method of manufacturing circuit devices, comprising:
preparing a laminated plate by laminating a thin first conductive film and a thick second conductive film via a third conductive film;
forming a fine conductive pattern layer by etching said first conductive film into a pattern;
removing the third conductive film by use of said conductive pattern layer as a mask and thus forming anchor portions where said third conductive film is depressed further inside than said conductive pattern layer;
fixedly fitting semiconductor elements on said conductive pattern layer via an insulating adhesive layer and partially filling said insulating adhesive layer into said anchor portions;
electrically connecting electrodes of said semiconductor elements with parts of said conductive pattern layer;
covering said semiconductor elements with a sealing resin layer and filling said sealing resin layer into said anchor portions; and
exposing said sealing resin layer and said third conductive film on the rear surface by removing said second conductive film.

11. The method of claim 10, wherein said third conductive film is used as an etching stopper when the first conductive film is etched.

12. The method of claim 11, wherein a solution containing ferric chloride or cupric chloride is used as a solution to perform said etching.

13. The method of claim 10, wherein said anchor portions are formed by overetching said third conductive film by use of said conductive pattern layer or a resist for forming said conducive pattern as a mask.

14. The method of claim 13, wherein said etching solution is an iodine-based solution.

15. The method of claim 10, wherein said third conductive film is peeled off by electrolysis by use of said conductive pattern layer or a resist for forming said conducive pattern as a mask, and said anchor portions are formed by over-peeling.

16. The method of claim 10, wherein said third conductive film and said sealing resin layer in said anchor portions, which remain after entirely etching the second conductive film, are exposed.

17. The method of claim 16, wherein external electrodes are formed by adhering a brazing filler material to the remaining third conductive film.

18. The method of claim 1 including:
selectively forming pads formed of a fourth conductive film on said first conductive film; and
electrically connecting the electrodes of said semiconductor elements with said pads.

19. The method of claim 18, wherein said third conductive film is used as an etching stopper when the first conductive film is etched.

20. The method of claim 19, wherein a solution containing ferric chloride or cupric chloride is used as a solution to perform said etching.

21. The method of claim 18, wherein said anchor portions are formed by over-etching said third conductive film by use of said conductive pattern layer or a resist for forming said conducive pattern as a mask.

22. The method of claim 21, wherein said etching solution is an iodine-based solution.

23. The method of claim 18, wherein said third conductive film is peeled off by electrolysis by use of said conductive pattern layer or a resist for forming said conducive pattern as a mask, and said anchor portions are formed by over-peeling.

24. The method of claim 18, wherein said third conductive film and said sealing resin layer in said anchor portions, which remain after entirely etching the second conductive film, are exposed.

25. The method of claim 24, wherein external electrodes are formed by adhering a brazing filler material to the remaining third conductive film.

* * * * *